(12) United States Patent
Cantrell et al.

(10) Patent No.: US 12,136,513 B2
(45) Date of Patent: Nov. 5, 2024

(54) MINIATURIZED ISOLATOR MODULES FOR INTRINSIC SAFETY APPLICATIONS

(71) Applicant: Analog Devices, Inc., Wilmington, MA (US)

(72) Inventors: Mark Stewart Cantrell, Windham, NH (US); Keith W. Bennett, Grand Isle, VT (US)

(73) Assignee: Analog Devices, Inc., Wilmington, MA (US)

( * ) Notice: Subject to any disclaimer, the term of this patent is extended or adjusted under 35 U.S.C. 154(b) by 293 days.

(21) Appl. No.: 17/513,850

(22) Filed: Oct. 28, 2021

(65) Prior Publication Data

US 2022/0051845 A1    Feb. 17, 2022

Related U.S. Application Data

(63) Continuation of application No. PCT/US2020/030230, filed on Apr. 28, 2020.
(Continued)

(51) Int. Cl.
*H01F 27/32* (2006.01)
*H01F 27/24* (2006.01)
(Continued)

(52) U.S. Cl.
CPC ............. *H01F 27/32* (2013.01); *H01F 27/24* (2013.01); *H02H 9/008* (2013.01); *H02H 9/042* (2013.01)

(58) Field of Classification Search
CPC ........ H01F 27/32; H01F 27/24; H01F 27/402; H01F 27/2804; H02H 9/008; H02H 9/042;
(Continued)

(56) References Cited

U.S. PATENT DOCUMENTS

| 3,818,273 A | 6/1974 | Nakashima |
| 4,360,850 A | 11/1982 | Howard et al. |

(Continued)

FOREIGN PATENT DOCUMENTS

| CA | 2028028 A1 | 4/1991 |
| DE | 10084799 T5 | 4/2004 |

OTHER PUBLICATIONS

International Search Report and Written Opinion mailed Sep. 10, 2020 for International Application No. PCT/US2020/030230.
(Continued)

*Primary Examiner* — Dharti H Patel
(74) *Attorney, Agent, or Firm* — Wolf, Greenfield & Sacks, P.C.

(57) ABSTRACT

Aspects of the present disclosure provide miniaturized isolator modules capable of transferring power and/or data signals across an isolation barrier by way of a transformer while maintaining intrinsic safety (IS) compliance. For example, the isolator modules may provide power from a non-IS side to an IS side of the isolation barrier while protecting the IS side in the event of an overvoltage and/or overcurrent event on the non-IS side. In some aspects, an isolator module includes one or more silicon protection devices, which facilitate the miniaturization of the isolator module while maintaining protection against overvoltage and/or overcurrent events in accordance with IS standards. In some aspects, an isolator module includes a transformer adapted for IS compliance. For example, coils of the transformer may be disposed on opposing sides of an isolation barrier having a thickness of at least 200 microns. Some aspects provide silicon protection devices formed on a single semiconductor die for use with miniaturized isolator modules to provide overvoltage and/or overcurrent protection for IS compliance. Miniaturized isolator modules and protection
(Continued)

devices described herein may be used either alone or in combination, in IS or non-IS environments.

20 Claims, 7 Drawing Sheets

Related U.S. Application Data

(60) Provisional application No. 62/840,368, filed on Apr. 29, 2019.

(51) Int. Cl.
*H02H 9/00* (2006.01)
*H02H 9/04* (2006.01)

(58) Field of Classification Search
CPC ......... H02H 9/041; H05K 2201/10181; H05K 1/0259
USPC ................................. 361/91.1, 91.5
See application file for complete search history.

(56) References Cited

U.S. PATENT DOCUMENTS

| | | | | |
|---|---|---|---|---|
| 4,412,241 | A * | 10/1983 | Nelson | H01L 23/5256 257/E27.047 |
| 5,144,517 | A | 9/1992 | Wieth | |
| 6,574,652 | B2 | 6/2003 | Brukhard | |
| 8,587,956 | B2 * | 11/2013 | Choutov | H05B 45/325 361/674 |
| 9,544,965 | B1 * | 1/2017 | O'Neil | H05B 45/10 |
| 10,845,395 | B2 * | 11/2020 | Williams | H02H 9/042 |
| 11,657,953 | B2 * | 5/2023 | Osada | H01F 27/2804 257/531 |
| 2002/0154520 | A1 | 10/2002 | Mercier | |
| 2003/0042571 | A1 * | 3/2003 | Chen | H04B 5/266 336/200 |
| 2004/0156160 | A1 * | 8/2004 | Choo | H02H 7/1252 361/118 |
| 2009/0160011 | A1 * | 6/2009 | Park | H01L 27/08 257/506 |
| 2010/0067156 | A1 * | 3/2010 | Lark | H02H 9/008 361/57 |
| 2015/0216044 | A1 * | 7/2015 | Tamagawa | H01L 27/016 361/752 |
| 2016/0146924 | A1 | 5/2016 | Williams | |
| 2016/0150620 | A1 * | 5/2016 | Lestician | H05B 45/3725 315/250 |
| 2017/0311396 | A1 * | 10/2017 | Sadwick | F21K 9/278 |
| 2017/0346276 | A1 | 11/2017 | Scanlon et al. | |
| 2018/0076154 | A1 * | 3/2018 | Bernardinis | H01L 25/18 |
| 2018/0205319 | A1 * | 7/2018 | Zhuo | H02M 3/33523 |
| 2020/0076512 | A1 * | 3/2020 | O'Sullivan | H01F 27/288 |
| 2021/0167169 | A1 * | 6/2021 | Tanghe | H01L 29/0649 |
| 2023/0108660 | A1 * | 4/2023 | Bradley | H02H 9/041 361/91.6 |

OTHER PUBLICATIONS

International Preliminary Report on Patentability mailed Nov. 11, 2021 for International Application No. PCT/US2020/030230.

[No Author Listed], Explosive atmospheres—Part 11: Equipment protection by intrinsic safety "i". International Standard IEC 60079-11. Jun. 2011. Edition 6.0. 340 pages.

[No Author Listed], MTL4500/5500 range. Intrinsically safe galvanic isolators. Eaton Electric Limited. EPS 45/5500. Mar. 2018. Rev 14. 55 pages.

* cited by examiner

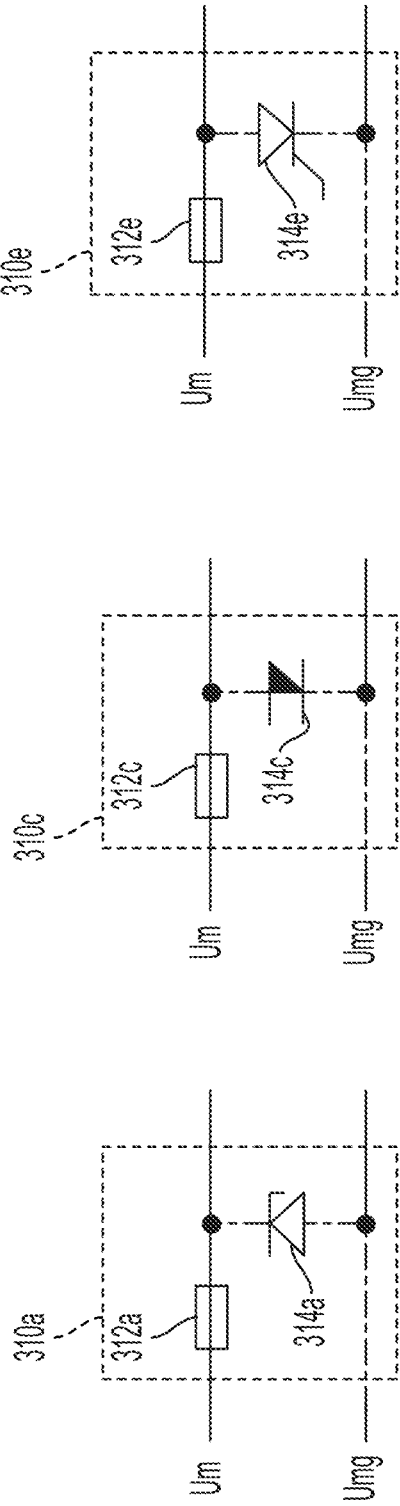
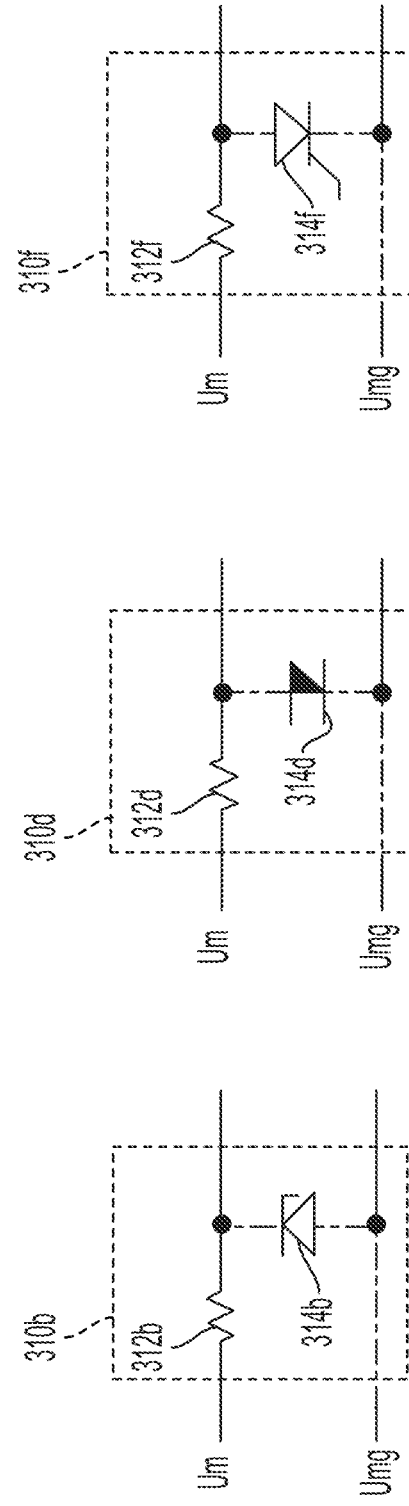

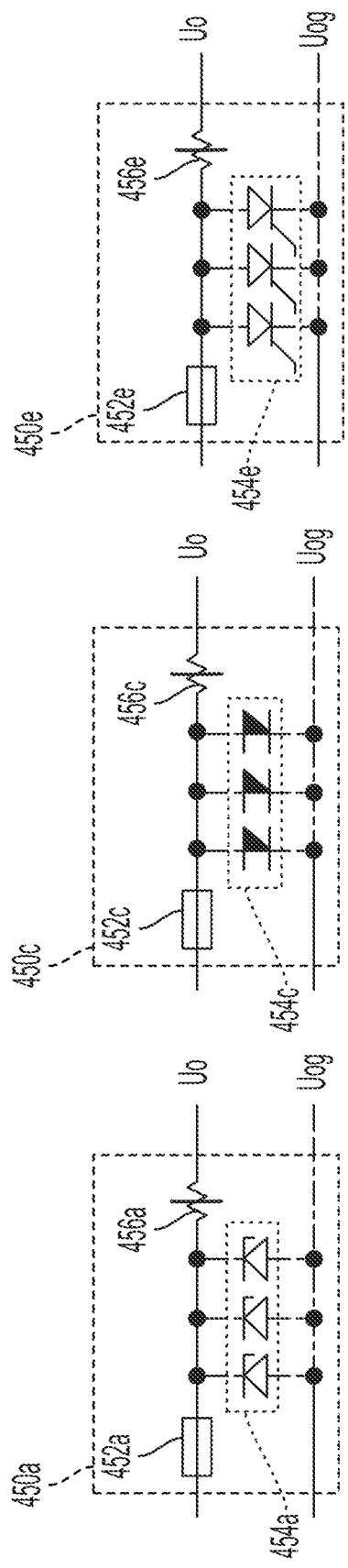
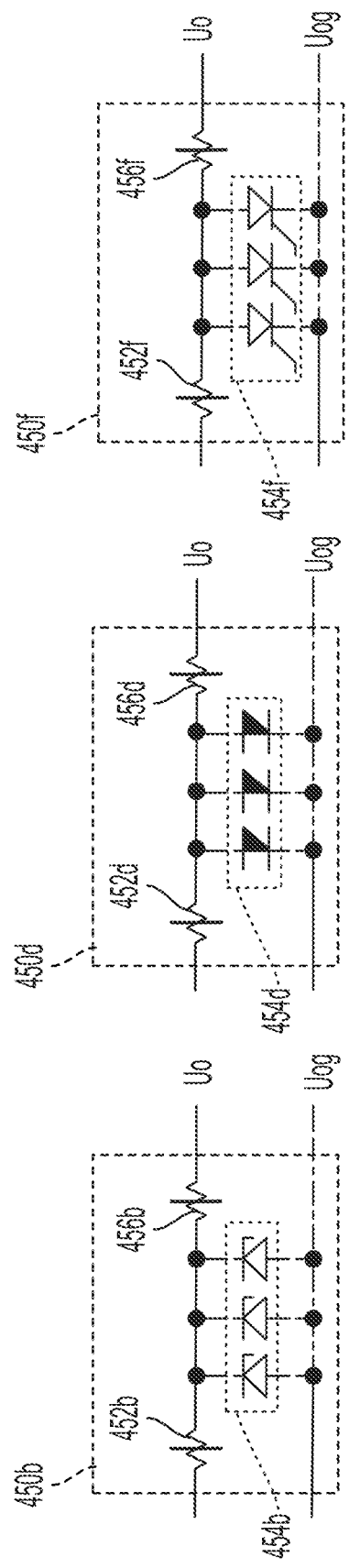

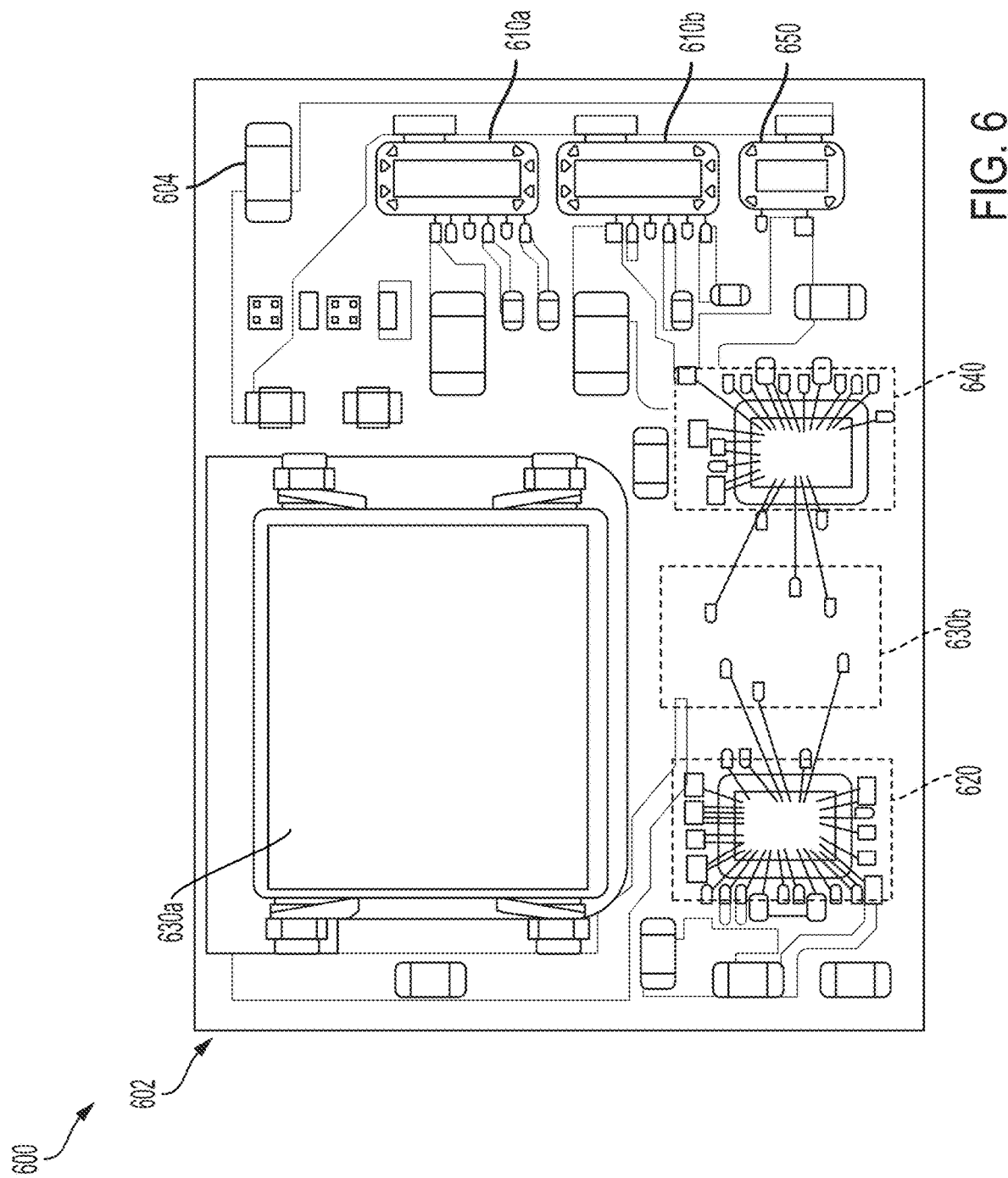

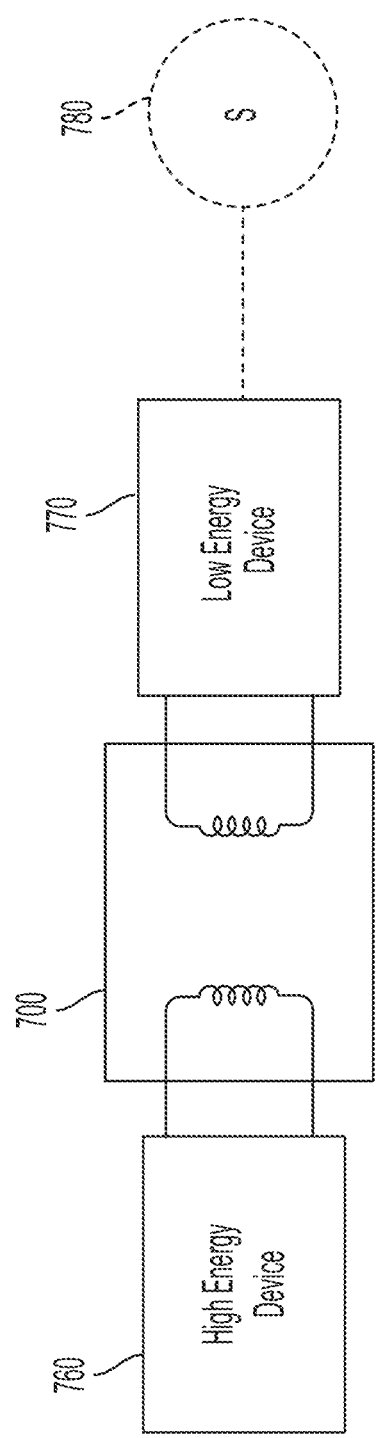

MINIATURIZED ISOLATOR MODULES FOR INTRINSIC SAFETY APPLICATIONS

CROSS-REFERENCE TO RELATED APPLICATIONS

This application is a Continuation of International Patent Application Serial No.: PCT/US2020/030230, filed Apr. 28, 2020, and entitled "MINIATURIZED ISOLATOR MODULES FOR INTRINSIC SAFETY APPLICATIONS," which is incorporated herein by reference in its entirety.

International Patent Application Serial No.: PCT/US2020/030230 claims the benefit under 35 U.S.C. § 119(e) of U.S. Provisional Application Ser. No. 62/840,368, filed Apr. 29, 2019, and entitled, "MINIATURIZED ISOLATOR MODULES FOR INTRINSIC SAFETY APPLICATIONS," which is incorporated herein by reference in its entirety.

FIELD OF THE DISCLOSURE

The present disclosure relates generally to isolator modules, and more particularly to miniaturized isolator modules for use in intrinsic safety applications.

BACKGROUND

Intrinsic safety (IS) is a protection technique for implementing electronics or electrical equipment in explosive environments to limit the available energy that could be used to ignite an explosion. Some examples of explosive environments include environments having a high concentration of gas, dust, or other flammable matter, such as a gasoline tank, a coal mine, or an oil rig. IS may be implemented in such environments by isolating the explosive environment and limiting the amount of electrical current and/or voltage of electrical signals provided to the environment from outside. For example, power and/or data signals may be provided across an isolation barrier from a non-IS environment to an IS environment. In this example, one or more protection devices are typically included to limit the amount of voltage and/or current provided across the isolation barrier to maintain the IS environment. IS standards referred to herein include international electrotechnical commission (IEC) 60079-11, which is an internationally accepted standard for isolation between an IS environment and a non-IS environment, and derivatives thereof.

SUMMARY OF THE DISCLOSURE

Aspects of the present disclosure provide miniaturized isolator modules capable of transferring power and/or data signals across an isolation barrier by way of a transformer while maintaining intrinsic safety (IS) compliance. For example, the isolator modules may provide power from a non-IS side to an IS side of the isolation barrier while protecting the IS side in the event of an overvoltage and/or overcurrent event on the non-IS side. In some aspects, an isolator module includes one or more silicon protection devices, which facilitate the miniaturization of the isolator module while maintaining protection against overvoltage and/or overcurrent events in accordance with IS standards. In some aspects, an isolator module includes a transformer adapted for IS compliance. For example, coils of the transformer may be disposed on opposing sides of an isolation barrier having a thickness of at least 200 microns. Some aspects provide silicon protection devices formed on a single semiconductor die for use with miniaturized isolator modules to provide overvoltage and/or overcurrent protection for IS compliance. Miniaturized isolator modules and protection devices described herein may be used either alone or in combination, in IS or non-IS environments.

In some embodiments, an isolator module for intrinsic safety applications may comprise a substrate, a first transformer integrated with the substrate comprising a primary coil disposed on a first side of an isolation barrier and a secondary coil disposed on a second side of the isolation barrier, and a first silicon protection device on the substrate coupled between a first input of the isolator module and the primary coil.

In some embodiments, a protection device for use with an isolator module may comprise a first semiconductor die having formed thereon a first current limiter, a first overvoltage device, and a fuse, and the first current limiter and the first overvoltage device may be configured to protect the fuse against overvoltage and overcurrent events.

In some embodiments, an isolator module for intrinsic safety applications may comprise a substrate, a first transformer formed in and around the substrate comprising a primary coil disposed on a first side of an isolation barrier and coupled to an input of the isolator module and a secondary coil disposed on a second side of the isolation barrier and coupled to an output of the isolator module, and the isolation barrier may have a thickness of at least 200 microns.

BRIEF DESCRIPTION OF DRAWINGS

FIG. 3A illustrates an exemplary active protection circuit including a fuse as a current limiter and a Zener diode as an overvoltage protection device, in accordance with some embodiments.

FIG. 3B illustrates an exemplary active protection circuit including a resistor as a current limiter and a Zener diode as an overvoltage protection device, in accordance with some embodiments.

FIG. 3C illustrates an exemplary active protection circuit including a fuse as a current limiter and a Shockley diode as an overvoltage protection device, in accordance with some embodiments.

FIG. 3D illustrates an exemplary active protection circuit including a resistor as a current limiter and a Shockley diode as an overvoltage protection device, in accordance with some embodiments.

FIG. 3E illustrates an exemplary active protection circuit including a fuse as a current limiter and a silicon controlled rectifier (SCR) as an overvoltage protection device, in accordance with some embodiments.

FIG. 3F illustrates an exemplary active protection circuit including a resistor as a current limiter and an SCR as an overvoltage protection device, in accordance with some embodiments.

FIG. 4A illustrates an exemplary active protection circuit including a fuse and a resistor-based attenuator as current limiters and Zener diodes as overvoltage protection devices, in accordance with some embodiments.

FIG. 4B illustrates an exemplary active protection circuit including resistor-based attenuators as current limiters and Zener diodes as overvoltage protection devices, in accordance with some embodiments.

FIG. 4C illustrates an exemplary active protection circuit including a fuse and a resistor-based attenuator as current limiters and Shockley diodes as overvoltage protection devices, in accordance with some embodiments.

FIG. 4D illustrates an exemplary active protection circuit including resistor-based attenuators as current limiters and Shockley diodes as overvoltage protection devices, in accordance with some embodiments.

FIG. 4E illustrates an exemplary active protection circuit including a fuse and a resistor-based attenuator as current limiters and SCRs as overvoltage protection devices, in accordance with some embodiments.

FIG. 4F illustrates an exemplary active protection circuit including resistor-based attenuators as current limiters and SCRs as overvoltage protection devices, in accordance with some embodiments.

FIG. 6 is a top view of an exemplary miniaturized isolator module, in accordance with some embodiments.

FIG. 7 illustrates an exemplary application for using a miniaturized isolator module, in accordance with some embodiments.

DETAILED DESCRIPTION

Figure 1:
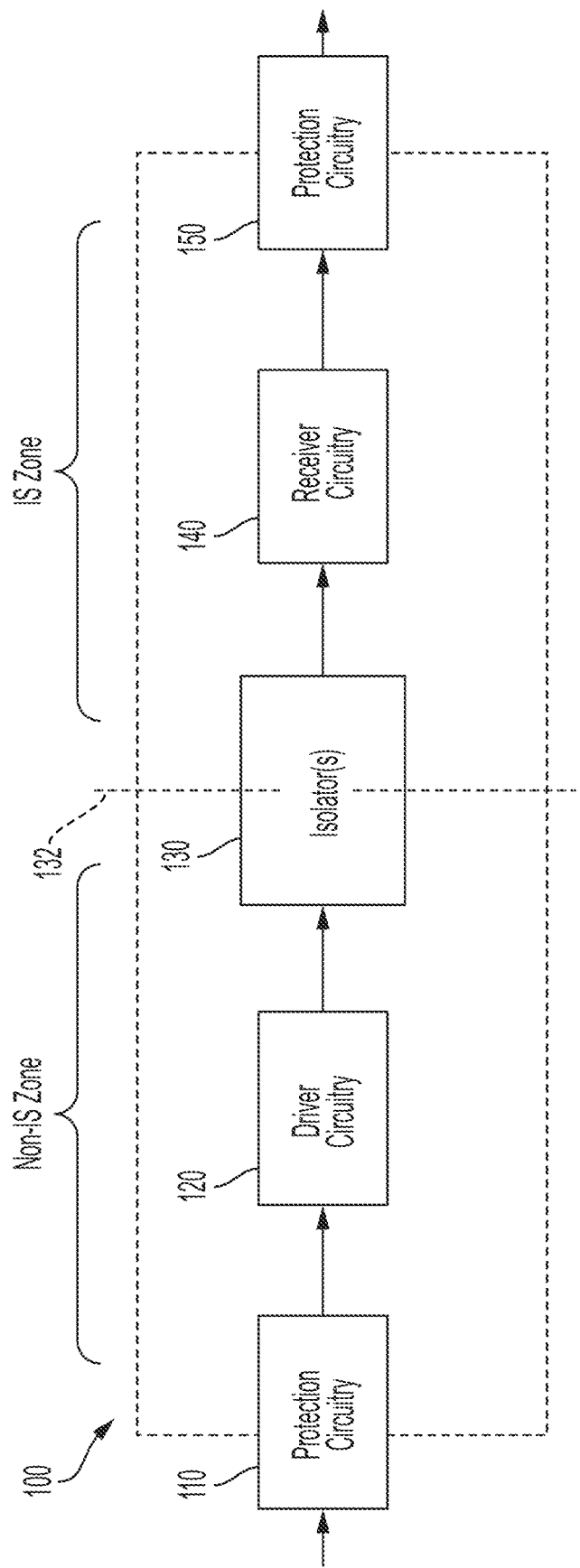
FIG. 1 is a block diagram illustrating an exemplary miniaturized isolator module for intrinsic safety applications, in accordance with some embodiments

Aspects of the present disclosure provide miniaturized isolator modules capable of transferring power and/or data signals across an isolation barrier by way of a transformer while maintaining intrinsic safety (IS) compliance. For example, the isolator modules may provide power from a non-IS side to an IS side of the isolation barrier while protecting the IS side in the event of an overvoltage and/or overcurrent event on the non-IS side. In some aspects, an isolator module includes one or more silicon protection devices, which facilitate the miniaturization of the isolator module while maintaining protection against overvoltage and/or overcurrent events in accordance with IS standards. In some aspects, an isolator module includes a transformer adapted for IS compliance. For example, coils of the transformer may be disposed on opposing sides of an isolation barrier having a thickness of at least 200 microns. Some aspects provide silicon protection devices formed on a single semiconductor die for use with miniaturized isolator modules to provide overvoltage and/or overcurrent protection for IS compliance. Miniaturized isolator modules and protection devices described herein may be used either alone or in combination, in IS or non-IS environments.

A typical isolator module may transfer power and/or data across an isolation barrier formed of isolation material from the IS side to the non-IS side. Some components of the isolator module may be formed on semiconductor dies. IS standards require protection for the isolator module to be redundant, so the isolator module typically includes 2-3 large protection devices such as Zener diodes positioned separate from the semiconductor dies and protecting a same node or area of the isolator module. Large, off-chip Zener diodes are conventionally used because they are simple and well understood devices.

However, the inventors recognized that the large size of conventionally preferable protection devices cause the isolator modules they protect to be large as a result. Protection devices are conventionally sized to dissipate a certain amount of power, which may be based on a series resistance or fuse at an input of the isolator module. The amount of power to be dissipated is often large, and so the protection devices need to be large to accommodate the power level. With between two to three protection devices per protected node of the isolator module, a given isolator module may have an excess of 10 protection devices within a large common housing. The housing may be made large enough to fit the protection devices which may require more space than other components of the isolator module, which may be formed on semiconductor dies. The inventors recognized that, when many isolator modules, each including large, conventional protection devices, are provided (e.g., stacked) together, the isolator modules take up a cumbersome amount of space.

The inventors also recognized that conventional isolator modules employ fuses separate from the semiconductor dies to allow an operator to replace blown fuses without needing to replace the whole isolator module. For example, fuses formed on the semiconductor dies are typically difficult or even impossible to remove and replace without replacing the entire isolator module. However, the inventors recognized that, as with the large Zener diodes, off-chip fuses also contribute to the large size of conventional isolator modules.

To overcome the problems of conventional isolator modules, the inventors have developed techniques for miniaturizing isolator modules while maintaining IS compliant protection. In some aspects, miniaturized isolator modules described herein may include smaller protection devices than conventional isolator modules. For example, the miniaturized isolator modules may include one or more silicon protection devices formed on one or more semiconductor dies. The silicon protection device(s) may include an overvoltage protection device and/or a current limiter, which may be active silicon protection devices such as transistor-based current limiters, discrete or integrated intrinsically safe resistors, and/or voltage regulating Zener diodes, Shockley diodes, silicon controlled rectifiers (SCRs), voltage camps, and/or crowbar circuits. The silicon protection device(s) may provide redundant protection in compliance with IS standards in a space-efficient manner. The inventors recognized that smaller protection devices may provide enhanced protection suitable for IS environments by providing coordinated protection. Devices can be manufactured at small size in silicon, and can be easily replicated. Thus, using silicon protection devices may facilitate the inclusion of more complex, coordinated, and redundant circuit protection (e.g., multiple copies of a protection circuit coupled together) in a small space. For example, if a silicon current limiter such as a transistor-based current limiter is positioned at an input of the isolator module and protection device system, the amount of power to be dissipated in the protection devices may be limited by the current limiter, such that other ones of the protection devices may be sized to accommodate a smaller power limit than without the current limiter. The resulting protection devices are small enough to include on-chip, obviating the need for large off-chip protection devices and facilitating an overall reduction in isolator module size. Moreover, because the miniature size of the resulting devices enables more protection devices to be implemented in redundant configurations while maintaining a reduced size as compared to conventional protection devices.

In some aspects, miniaturized isolator modules developed by the inventors may include a fuse formed on a semiconductor die with one or more protection devices configured to protect the fuse from overvoltage and/or overcurrent events. The inventors recognized that lowering a risk of the fuse blowing, such as by protecting the fuse with silicon protection devices, enables the fuse to be formed on a semiconductor die, because the fuse is much less likely to be replaced. For example, a current limiter may be placed in series before the fuse to prevent overcurrent from blowing the fuse, and so the fuse may only blow if the current limiter fails. As a result, the fuse may be replaced only when other portions of the isolator module are also damaged, such that the entire isolator module may be replaced beyond just the fuse.

Turning to the figures, FIG. 1 is a block diagram illustrating an exemplary miniaturized isolator module 100 for IS applications, in accordance with some embodiments. Isolator module 100 includes protection circuitry 110, driver circuitry 120, one or more isolators 130, receiver circuitry 140, and protection circuitry 150. In some embodiments, isolator module 100 may be a system-in-package (SIP) formed on one or more semiconductor dies and contained within a single integrated circuit package. In some embodiments, components of isolator module 100 may be contained in multiple separate integrated circuit packages and configured for mounting to a common substrate, such as a printed circuit board (PCB). In FIG. 1, protection circuitry 110 and driver circuitry 120 are positioned on a non-IS side of isolator(s) 130, and receiver circuitry 140 and protection circuitry 150 are positioned on an IS side of isolator(s) 130. In some embodiments, driver circuitry 120 may include one or more power and/or data components configured to transmit power and/or data signals across isolator(s) 130 to receiver circuitry 140. Receiver circuitry 140 may include one or more power and/or data components configured to receive the power and/or data signals from driver circuitry 120. Protection circuitry 110 may be configured to protect components on the non-IS side of isolator(s) 130, such as driver circuitry 120, from overvoltage and/or overcurrent events, such as surge and/or electrostatic discharge (ESD) events. Protection circuitry 150 may be configured to protect components on the IS side of isolator(s) 130, such as receiver circuitry 140, from overvoltage and/or overcurrent events.

In some embodiments, protection circuitry 110 may include active protection circuitry configured to protect components on the non-IS side of isolator(s) 130 from overvoltage and/or overcurrent events. In some embodiments, the active protection circuitry may include one or more silicon protection devices. In some embodiments, the active protection circuitry may include one or more overvoltage protection devices and/or one or more current limiters. In some embodiments, overvoltage protection devices included in protection circuitry 110 may include Zener diodes, Shockley diodes, silicon controlled rectifiers (SCRs), voltage clamps, and/or crowbar circuits configured to regulate (e.g., maintain) a voltage across protection circuitry 110. For example, a Zener diode may regulate a voltage across a junction of the diode (e.g., a P-N junction). In some embodiments, when protection circuitry 110 is exposed to an overvoltage condition, the overvoltage device(s) of the active protection circuitry may be configured to prevent the voltage from reaching components on the non-IS side of isolator(s) 130 and/or to dissipate the energy to ground. Overcurrent conditions may similarly be addressed by preventing the current from reaching components on the non-IS side. In some embodiments, an overvoltage event may occur at voltages on the order of tens of Volts to thousands of volts (kilovolts (kV)).

In some embodiments, current limiters included in protection circuitry 110 may include fuses, resistors (e.g., intrinsically safe resistors, discrete and/or integrated thin film resistors, etc.), and/or attenuators (e.g., transistor-based and/or resistor-based attenuators, etc) configured to regulate (e.g., maintain) current entering the isolator module. In some embodiments, when protection circuitry 110 is exposed to a high current (e.g., on the order of kiloamps (kA), such as 1.5 kA), the current limiter(s) of the active protection circuitry may be configured to prevent the high current from reaching components on the non-IS side of isolator(s) 130 and to dissipate the high current to ground. In some embodiments, regulated current or voltage levels of protection devices described herein may be maintained below overvoltage and/or overcurrent conditions. The overvoltage and/or overcurrent conditions may be set based on the components of isolator module 100 and/or components connected thereto that protection circuitry 110 is configured to protect. By preventing components on the non-IS side of isolator(s) 130 from being exposed to overvoltage and/or overcurrent events, protection circuitry 110 may also provide protection for components on the IS side of isolator(s) 130. For example, protection circuitry 110 may prevent high energy from overvoltage and/or overcurrent events from dissipating in components of isolator module 100 and/or components connected thereto, which would result in dangerous levels of heat and potentially cause an explosion, thereby compromising intrinsic safety.

In some embodiments, driver circuitry 120 may include one or more power and/or data components configured to transmit power and/or data signals to receiver circuitry 140 across isolator(s) 130. For example, in some embodiments, driver circuitry 120 may include one or more switches configured to generate a switching power signal for transmitting across isolator(s) 130. Alternatively or additionally, in some embodiments, driver circuitry 120 may include switch driver circuitry configured to bias one or more switches across isolator(s) 130. Alternatively or additionally, in some embodiments, driver circuitry 120 may include an interface controller configured to generate an analog and/or digital data signal for transmitting across isolator(s) 130. In some embodiments, power and/or data components of driver circuitry 120 may receive input signals via protection circuitry 110, such that protection circuitry 110 may prevent overcurrent and/or overvoltage events from damaging the components of driver circuitry 120, and/or from being transmitted across isolator(s) 130 to the IS side. In one example, power switches of driver circuitry 120 may be configured to receive and modulate a power signal via protection circuitry 110, and protection circuitry 110 may prevent overvoltage and/or overcurrent from the power signal from reaching the power switches and causing damage to the switches on the non-IS side and/or components on the IS side of isolator(s) 130. Alternatively or additionally, in one example, an interface controller of driver circuitry 120 may be configured to receive and modulate a data signal via protection circuitry 110, and protection circuitry 110 may prevent overvoltage and/or overcurrent from the data signal from reaching the interface controller and causing damage to the controller on the non-IS side and/or components on the IS side of isolator(s) 130.

In some embodiments, isolator(s) 130 may include a power isolator and/or a data isolator configured to transmit power and/or data signals across isolation barrier 132. In some embodiments, the power isolator and/or data isolator may include a coil transformer having a primary winding on the non-IS side of isolation barrier 132 and a secondary winding on the IS side of isolation barrier 132. In some embodiments in which isolator module 100 includes a substrate supporting components of the module, the primary and secondary windings of the coil transformer may wrap in and around the substrate. In some embodiments, isolator(s) 130 may alternatively or additionally include one or more capacitive and/or optical isolators.

In some embodiments, receiver circuitry 140 may include one or more power and/or data components configured to receive the power and/or data signal from driver circuitry 120 across isolator(s) 130. For example, in some embodiments, receiver circuitry 140 may include rectification and/or filter components configured to condition a power signal received across isolator(s) 130 for use on the IS side of isolator(s) 130. Alternatively or additionally, receiver circuitry 140 may include an interface controller configured to receive a data signal across isolator(s) 130 and condition the data signal for use on the IS side of isolator(s) 130. In some embodiments, power and/or data components of receiver circuitry 140 may provide power and/or data signals received over isolator(s) 130 to other components on the IS side of isolator(s) 130 via protection circuitry 150, such that protection circuitry 150 may prevent overcurrent and/or overvoltage from reaching components on the IS side from the received power and/or data signals as described for protection circuitry 110 and driver circuitry 120.

In some embodiments, protection circuitry 150 may be configured in the manner described for protection circuitry 110, such as including one or more overvoltage and/or overcurrent devices and/or current limiters configured to prevent overvoltage and/or overcurrent transferred across isolator(s) 130 from the non-IS side from reaching components on the IS side.

It should be appreciated that some embodiments may not include protection circuitry on the IS or non-IS side of the isolator(s), depending on the intrinsic safety requirements of the particular application. For example, protection circuitry on the non-IS side of the isolator(s) may be configured to also protect components on the IS side, and/or protection circuitry on the IS side of the isolator(s) may be configured to also protect components on the non-IS side, according to various embodiments. It should also be appreciated that, in some embodiments, receiver circuitry on the IS side of the isolator(s) may be configured to transmit power and/or data signals to driver circuitry on the non-IS side of the isolator(s).

Miniaturized isolator modules described herein may be suitable for use in IS applications. According to an aspect of the present disclosure, isolators for IS applications may need to satisfy various requirements set forth in IEC 60079-11 to limit the amount of available energy provided to an IS environment. Such requirements include clearance, separation distance through a casting compound, separation distance through solid isolation, creepage distance, distance under coating, and comparative tracking index (CTI). For example, according to Table 5 of IEC 60079-11, an isolator module is required to have at least 600 microns to 1 mm of separation distance through solid insulation for protection up to 375 volts (peak). According to the slightly relaxed standard of Table F.1 of IEC 60079-11, an isolator module is required to have at least 200 microns of separation distance through solid insulation for protection up to 300 root-mean-squared volts ($V_{RMS}$).

The inventors have taken steps to ensure the miniaturized isolator modules described herein maintain compliance with IS standards. For example, isolator modules described herein may meet the structural requirements of IEC 60079-11, such as including isolation barriers having a thickness of at least 200 microns. In addition to meeting the various requirements set by IS standards, isolator modules described herein including coil transformers may include insulative material disposed between adjacent loops of the primary coils and/or adjacent loops of the secondary coils of the transformers. In some instances, the insulative material may reduce the likelihood of short-circuiting between the adjacent loops. In some aspects, coils of transformers described herein may be doubly-insulated. For example, a first insulative material may be provided around wires of the coils, and a second insulative material may be provided to fill air gaps around the transformer, such as gaps not occupied by the coils or a magnetic core of the transformer. The inventors recognized that additional insulation in the transformer may enhance isolation provided by the isolator module between the IS and non-IS sides of the isolation barrier.

Figure 2:
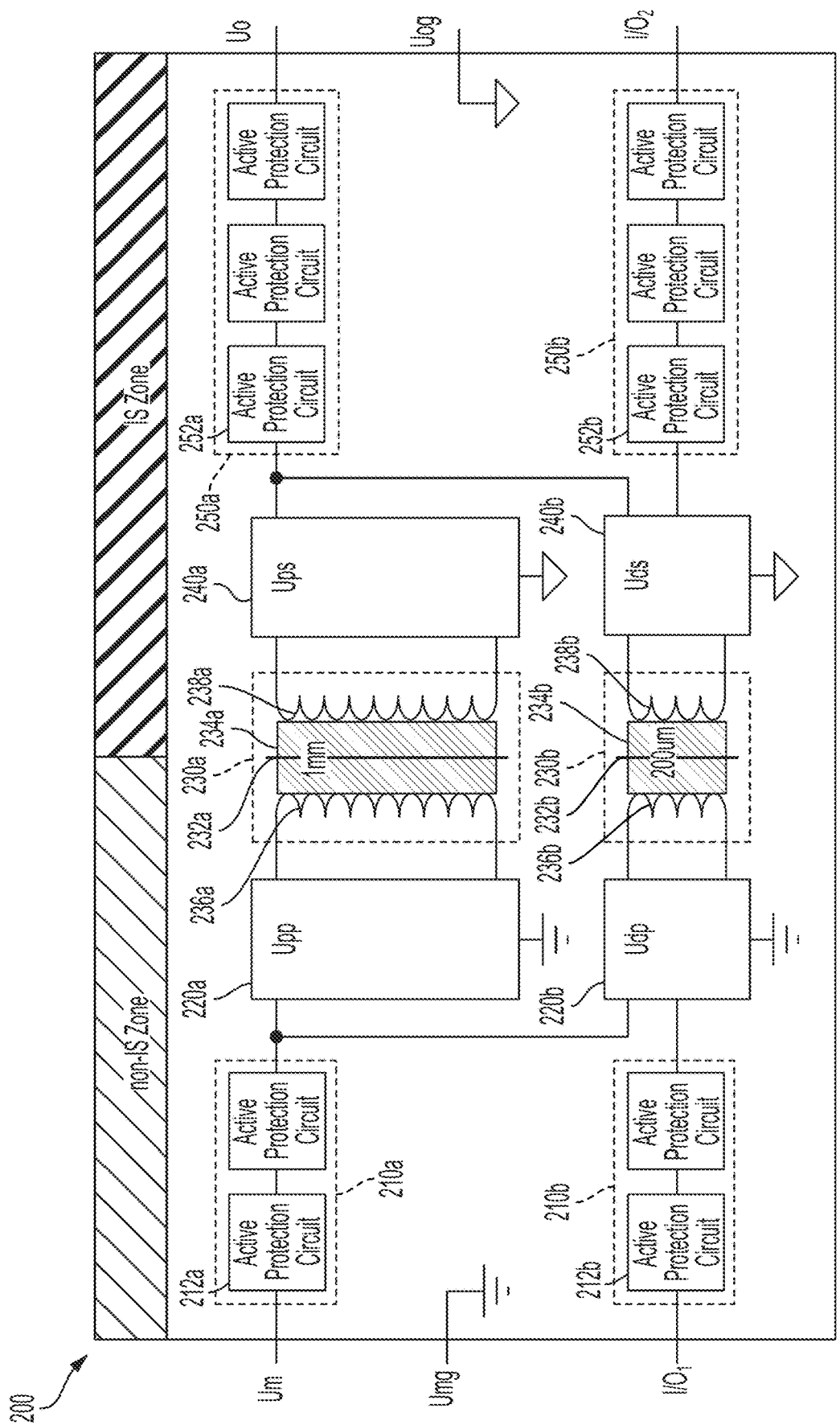
FIG. 2 is a block diagram illustrating an exemplary miniaturized isolator module, in accordance with some embodiments.

FIG. 2 is a block diagram illustrating an exemplary miniaturized isolator module 200, which may be configured in the manner described for isolator module 100. For instance, isolator module 200 includes protection circuitry 210a and 210b, driver circuitry 220a and 220b, isolators 230a and 230b, receiver circuitry 240a and 240b, and protection circuitry 250a and 250b, which may be configured in the manner described for protection circuitry 110, driver circuitry 120, isolator(s) 130, receiver circuitry 140, and protection circuitry 150, respectively. As shown in FIG. 2, isolator module 200 may be configured to transmit power and data signals across isolators 230a and 230b respectively. For example, in some embodiments, driver circuitry 220a and receiver circuitry 240a may include power components, and driver circuitry 220b and receiver circuitry 240b may include data components. In some embodiments, isolator 230a may be a power, and isolator 230b may be a data isolator.

As shown in FIG. 2, protection circuitry 210a is coupled between input node Um and driver circuitry 220a and 220b, and protection circuitry 210b is coupled between input node I/O$_1$ and driver circuitry 220b. In some embodiments, protection circuitry 210a may be configured to receive and provide a power signal to driver circuitry 220a and 220b via node Um while protecting driver circuitry 220a and 220b from overcurrent and/or overvoltage in the power signal. In some embodiments, protection circuitry 210b may be configured to receive and provide a data signal to driver circuitry 220b from node I/O$_1$ while protecting driver circuitry 220b from overcurrent and/or overvoltage in the data signal.

As shown in FIG. 2, each of protection circuitry 210a and 210b include multiple active protection circuits 212a and 212b, respectively. In some embodiments, active protection circuits 212a and/or 212b may be formed on a silicon and/or other semiconductor substrate material. In some embodiments, multiple active protection circuits 212a and 212b of protection circuitry 210a and 210b may be configured to provide redundant protection, such that the failure of one active protection circuit 212a or 212b does not compromise protection for isolator module 200. Alternatively or additionally, the redundant active protection circuits 212a and/or 212b may be configured in a manner wherein the active protection circuits protect one another from breaking during an overvoltage and/or overcurrent event. In one example, active protection circuits 212a and/or 212b of protection circuitry 210a and/or 210b may include a fuse and one or more current limiters and/or overvoltage devices configured to protect the fuse from overcurrent and/or overvoltage events. In some embodiments, the fuse may be formed on a same semiconductor die as the current limiters and/or overvoltage devices. In some instances, the fuse may not blow unless the current limiters and/or overvoltage devices fail. For example, the current limiter(s) may prevent the fuse from conducting more than a regulated amount of current, thus preventing the fuse from blowing due to over-current. A fuse may be considered blown when it can no longer allow sufficient current and/or voltage to pass through the fuse for the isolator module to operate. For example, a blown fuse may prevent the isolator module from delivering power, and/or transmitting, and/or receiving data across the isolation barrier. In addition, the current limiter(s) may limit the amount of energy to be dissipated in the overvoltage device(s) by limiting the amount of current to which the overvoltage device(s) is/are exposed. Some exemplary configurations of active protection circuits 212a and 212b that may be included in protection circuitry 210a and/or 210b are described further herein including with reference to FIGS. 3A-3F. In some embodiments, fuses described herein may be configured to blow permanently such that blowing the fuse requires replacement of the blown fuse with a new fuse. In some embodiments, a fuse may be configured activate in response to an overcurrent event by no longer conducting current, so as to prevent overcurrent from passing through the fuse, and to return to conducting current when the overcurrent event is no longer present. In some embodiments, fuses described herein may be connected in series with one or more of active protection circuits 212a and/or 212b.

In some embodiments, one or more of active protection circuits 212a and/or 212b may be a switch, such as a microelectromechanical system (MEMS) switch, or a solid-state switch. For example, the switch may be configured to open when an overcurrent condition is reached to prevent the current from passing through the switch. In accordance with various embodiments, the switch may be a field effect transistor (FET), such as a metal oxide semiconductor (MOS) FET, a bipolar junction transistor, and/or the like. In some embodiments, the switch may be coupled in series with one or more of the other active protection circuits 212a and/or 212b.

As shown in FIG. 2, isolator 230a includes isolation barrier 232a, formed using insulation material 234a, and a coil transformer including primary coil 236a on the non-IS side of isolator 230a and secondary coil 238a on the IS side of isolator 230a. In some embodiments, primary coil 236a and/or secondary coil 238a may be positioned proximate a magnetic core. For example, in some embodiments, primary coil 236a and/or secondary coil 238a may be wound about the magnetic core. Alternatively or additionally, in some embodiments, primary coil 236a and/or secondary coil 238a may be stacked relative to the magnetic core, such as being sandwiched between multiple layers of magnetic material. In some embodiments, insulation material 234a may include multiple layers of the same or different insulative materials. In some embodiments, one or more layers of the insulation material may be disposed in gaps of the magnetic core. As shown, insulation material 234a has a thickness of 1 mm. It should be appreciated that insulation material 234a may have various thicknesses, such as 200 microns, 400 microns, 600 microns, 800 microns. In some embodiments, primary coil 236a and secondary coil 238a may be wound in and around insulation material 234a such that insulation material 234a is disposed between adjacent loops of primary coil 236a and/or adjacent loops of secondary coil 238a to prevent short-circuiting the adjacent loops.

As shown in FIG. 2, isolator 230b includes isolation barrier 232b, formed using insulation material 234b, and a coil transformer including primary coil 236b on the non-IS side of isolator 230b and secondary coil 236b on the IS side of isolator 230b. Isolator 230b may be configured in the manner described for isolator 230a. For example, the coil transformer of isolator 230b may be configured in the manner described for the coil transformer of isolator 230a. As shown, insulation material 234b has a thickness of 200 microns. It should be appreciated that insulation material 234b may have various thicknesses, such as 400 microns, 600 microns, 800 microns, or 1 mm.

As shown in FIG. 2, protection circuitry 250a is coupled between receiver circuitry 240a and 240b and output node Uo, and protection circuitry 250b is coupled between receiver circuitry 240b and output node I/O$_2$. In some embodiments, protection circuitry 250a may be configured to receive and provide a power signal from receiver circuitry 240a and 240b to node Uo while protecting components on the IS side, such as components of isolator module 200 and/or components connected thereto, from overcurrent and/or overvoltage in the power signal. That is, in some embodiments the protection circuitry 250a may perform one or both of the functions of protecting external components from experiencing overvoltage or overcurrent events, and protecting components on the IS side from overvoltage and overcurrent events, In some embodiments, protection circuitry 250b may be configured to receive and provide a data signal from receiver circuitry 240b to node I/O$_2$ while protecting components on the IS side from overcurrent and/or overvoltage in the data signal. Also shown in FIG. 2, each of protection circuitry 250a and 250b include multiple active protection circuits 252a and 252b, respectively, that may be configured to provide redundant protection for isolation module 200, and/or configured such that active protection circuits 252a and/or 252b protect one another as described for active protection circuits 212a and 212b of protection circuitry 210a and 210b. Some exemplary configurations of active protection circuits 252a and 252b that may be included in protection circuitry 250a and/or 250b are described further herein including with reference to FIGS. 4A-5.

For purposes of illustration, a first non-limiting embodiment of isolator module 200 is now described. According to the first non-limiting embodiment, isolator module 200 includes a substrate. For example, the substrate may be formed of one or more layers of a printed circuit board. In the non-limiting embodiment, isolator module 200 further includes a first transformer integrated with the substrate, with a primary coil disposed on a first side of an isolation barrier and a secondary coil disposed on a second side of the isolation barrier. In the first non-limiting embodiment, isolator module 200 further includes a first silicon protection device on the substrate coupled between a first input of isolator module 200 and the primary coil.

In the first non-limiting embodiment, the first silicon protection device includes one or more first semiconductor dies having an overvoltage device, a current limiter, and a fuse formed thereon, with the fuse coupled to the overvoltage device and the current limiter. For example, the first semiconductor die(s) may be soldered or otherwise adhered to a surface of the substrate.

In the first non-limiting embodiment, isolator module 200 includes a second transformer formed in and around the substrate, with a primary coil disposed on the first side of the isolation barrier and a secondary coil disposed on the second side of the isolation barrier. The first transformer is a power transformer configured to transmit a power signal across the isolation barrier, and the second transformer is a data transformer configured to transmit a data signal across the isolation barrier. The second transformer is further configured to transmit data signals bi-directionally across the isolation barrier, In the first non-limiting embodiment, isolator module 200 includes a second silicon protection device on the substrate coupled between a second input of isolator module 200 and the primary coil of the second transformer. The second silicon protection device includes at least one second semiconductor die having formed thereon an intrinsically safe resistor. For example, the second semiconductor die(s) may be soldered or otherwise adhered to the same or a different surface of the substrate.

In the first non-limiting embodiment, isolator module 200 includes a third silicon protection device on the substrate coupled between the secondary coil of the first transformer and a first output of isolator module 200, and a fourth silicon protection device on the substrate coupled between the secondary coil of the second transformer and a second output of the isolator module. The third silicon protection device includes one or more third semiconductor dies having an overvoltage device and a current limiter formed thereon, and the fourth silicon protection device includes one or more fourth semiconductor dies having an intrinsically safe resistor formed thereon. For example, the third and fourth semiconductor die(s) may be soldered or otherwise adhered to the same or a different surface (or surfaces) of the substrate.

In the first non-limiting embodiment, the first, second, third and fourth silicon protection devices are configured to maintain intrinsic safety compliance on the second side of the isolation barrier.

According to a second non-limiting embodiment of isolator module 200, the isolator module includes a substrate with a first transformer formed in and around the substrate. The first transformer includes a primary coil disposed on a first side of an isolation barrier and coupled to an input of the isolator module, and a secondary coil disposed on a second side of the isolation barrier and coupled to an output of the isolator module. In the second non-limiting embodiment, the isolation barrier has a thickness of at least 200 microns.

In the second non-limiting embodiment, the first and second transformers each include an electrical conductor forming a plurality of loops, with the each of the plurality of loops of the electrical conductor surrounded by a first insulating layer.

In the second non-limiting environment, the pluralities of loops of the primary and secondary coils are wound around a common magnetic core, with a second insulating layer disposed in gaps between the first insulating layer and the magnetic core.

It should be appreciated that aspects of the first and second non-limiting embodiments may be combined in a single non-limiting embodiment.

FIGS. 3A-3F illustrate exemplary active protection circuits 310a-310f that may be included as part of protection circuitry 110, 210a, and 210b on the non-IS side of isolator modules 100 and 200, in accordance with some embodiments. In accordance with various embodiments, active protection circuits described herein may include redundant active protection circuits illustrated in FIGS. 3A-3F, such as multiple of a single type of active protection circuit and/or multiple different types of active protection circuits. In some embodiments, protection circuitry including redundant active protection circuitry may be formed on a single semiconductor die. In some embodiments, protection circuitry including redundant active protection circuitry may be formed on multiple respective semiconductor dies and packaged in a single integrated circuit package, or in multiple respective integrated circuit packages. It should be appreciated that, in some embodiments, any or each of active protection circuits 310a-310f illustrated in FIGS. 3A-3F may be included in protection circuitry 150, 250a, and/or 250b.

FIG. 3A illustrates active protection circuit 310a including fuse 312a as a current limiter and Zener diode 314a as an overvoltage protection device.

FIG. 3B illustrates active protection circuit 310b including resistor 312b as a current limiter and Zener diode 314b as an overvoltage protection device.

FIG. 3C illustrates active protection circuit 310c including fuse 312c as a current limiter and Shockley diode 314c as an overvoltage protection device.

FIG. 3D illustrates active protection circuit 310d including resistor 312d as a current limiter and Shockley diode 314d as an overvoltage protection device.

FIG. 3E illustrates active protection circuit 310e including fuse 312e as a current limiter and silicon controlled rectifier (SCR) 314e as an overvoltage protection device.

FIG. 3F illustrates active protection circuit 310f including resistor 312f as a current limiter and SCR 314f as an overvoltage protection device. In some embodiments, resistors 312b, 312d, and/or 312f may be discrete or integrated thin film resistors. In some embodiments, resistors 312b, 312d, and/or 312f may be intrinsically safe resistors. In some embodiments, resistors 312b, 312d, and/or 312f may satisfy the intrinsic safety standards set forth in IEC 60079-11, such as particular spacing requirements of IEC 60079-11. The examples of FIGS. 3A-3F are non-limiting examples. Various other configurations of active protection circuitry may be provided.

FIGS. 4A-4F illustrate exemplary active protection circuits 450a-450f that may be included as part of protection circuitry 150, 250a, and 250b on the IS side of isolator modules 100 and 200, in accordance with some embodiments. In accordance with various embodiments, protection circuitry described herein may include redundant active protection circuits, such having multiple ones of active protection circuits 450a-450f (e.g., multiple ones of a same type of active protection circuit and/or multiple ones of different types, etc.). In some embodiments, protection circuitry including redundant active protection circuitry may be formed on a single semiconductor die. In some embodiments, protection circuitry including redundant active protection circuitry may be formed on multiple respective semiconductor dies and packaged in a single integrated circuit package, or in multiple respective integrated circuit packages. It should be appreciated that, in some embodiments, any or each of active protection circuits 450a-450f illustrated in FIGS. 4A-4F may be included as part of protection circuitry 110, 210a, and/or 210b.

FIG. 4A illustrates active protection circuit 450a including fuse 452a and resistor-based attenuator 456a as current limiters and Zener diodes 454a as overvoltage protection devices.

FIG. 4B illustrates active protection circuit 450b including resistor-based attenuators 452b and 456b as current limiters and Zener diodes 454b as overvoltage protection devices.

FIG. 4C illustrates active protection circuit 450c including fuse 452c and resistor-based attenuator 456c as current limiters and Shockley diodes 454c as overvoltage protection devices.

FIG. 4D illustrates active protection circuit 450d including resistor-based attenuators 452d and 456d as current limiters and Shockley diodes 454d as overvoltage protection devices.

FIG. 4E illustrates active protection circuit 450e including fuse 452e and resistor-based attenuator 456e as current limiters and SCRs 454e as overvoltage protection devices.

FIG. 4F illustrates active protection circuit 450f including resistor-based attenuators 452f and 456f as current limiters and SCRs 454f as overvoltage protection devices.

FIGS. 4A-4F are non-limiting examples. Various other configurations of protection circuitry may be provided.

Figure 5:
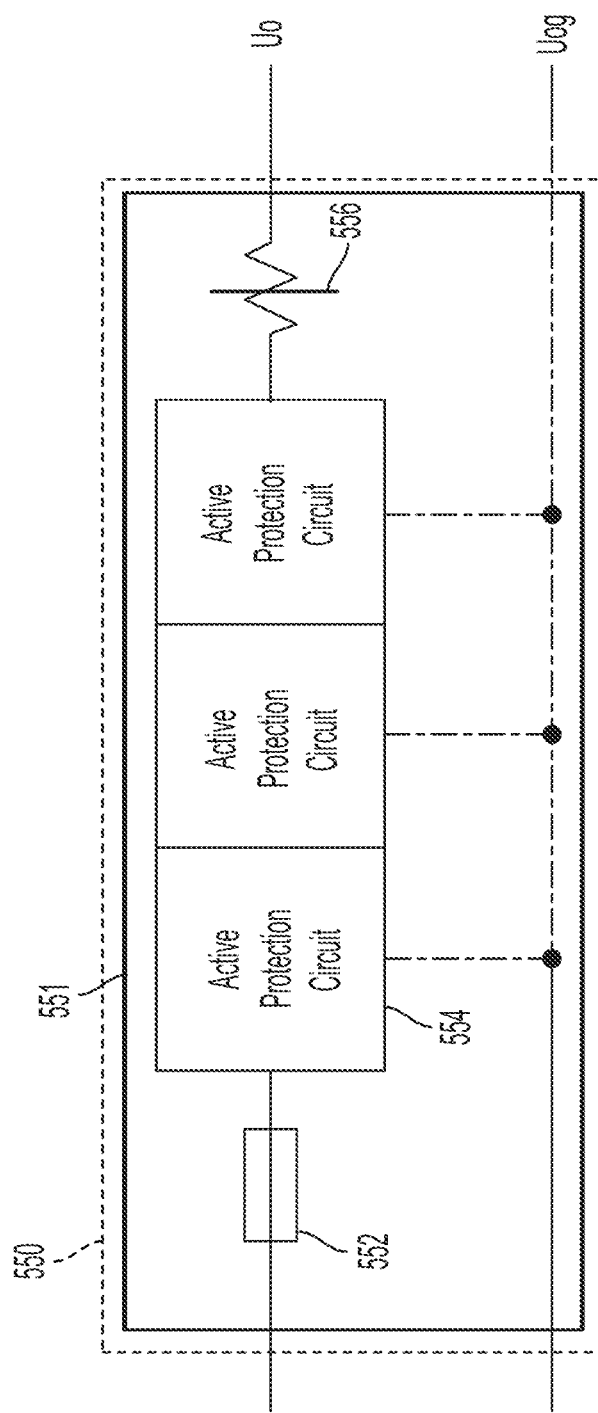
FIG. 5 illustrates exemplary protection circuitry that may be included in a miniaturized isolator module, in accordance with some embodiments.

FIG. 5 illustrates protection circuitry 550, which may be included as protection circuitry 110, 150, 210a, 210b, 250a, and/or 250b on the non-IS side and/or IS side of isolator modules 100 and 200. Protection circuitry 550 is shown on single semiconductor die 551. Protection circuitry 550 includes fuse 552, active protection circuits 554, and resistor-based attenuator 556. As described in connection with FIGS. 3A-3F and 4A-4F, fuse 552 and resistor-based attenuator 556 may serve as current limiters. As shown in FIG. 5, protection circuitry 550 includes three active protection circuits 554 coupled in parallel between fuse 552 and resistor-based attenuator 556. In some embodiments, each active protection circuit 554 may include one or more current limiters and/or overvoltage protection devices. For example, in some embodiments, each active protection circuit 554 may be selected from among active protection circuits 310a-310f and/or 450a-450f described in connection with FIGS. 3A-3F and 4A-4F, respectively. In some embodiments, one or more active protection circuits 554 may include only some components of active circuits 310a-310f and/or 450a-450f. In some embodiments, one or more active protection circuits 554 may include a switch, such as described for protection circuitry 210a in connection with FIG. 2. It should be appreciated that protection circuitry 550 may be formed on multiple semiconductor dies and packaged in a single integrated circuit package, or in multiple integrated circuit packages. In some embodiments, fuse 552 may be positioned on a separate semiconductor die, and/or may be a discrete component connected to semiconductor dies having other components of protection circuitry 550 thereon.

For purposes of illustration, a non-limiting embodiment of protection device 550 for use with an isolator module is now described. According to the non-limiting embodiment, protection device 500 includes a first semiconductor die having a first current limiter, a first overvoltage device, and a fuse formed thereon, where the first current limiter and the first overvoltage device are configured to protect the fuse against overvoltage and overcurrent events.

In the non-limiting embodiment, the first current limiter is positioned to limit a current provided from a first side to a second side of the isolator module, and the first overvoltage device is positioned to limit a voltage at the first input of the isolator module.

In the non-limiting embodiment, the first current limiter includes an active current limiter configured to regulate the current provided to a transformer of the isolator module, and the first overvoltage device comprises a Zener diode configured to regulate the voltage at the transformer of the isolator module.

In the non-limiting embodiment, responses of the first current limiter and the first overvoltage device are coordinated with one another to protect the fuse against the overvoltage and overcurrent events.

In the non-limiting embodiment, the first current limiter and the first overvoltage device are configured to respond to overvoltage and overcurrent events before the fuse is blown.

In the non-limiting embodiment, the first semiconductor die also has a second current limiter and a second overvoltage device formed thereon, with the second current limiter and the second overvoltage devices being configured to protect the fuse against overvoltage and overcurrent events.

In the non-limiting embodiment, the first and second current limiters include first and second active current limiters configured to regulate a current provided to a transformer of the isolator module, and the first and second overvoltage devices include first and second Zener diodes configured to regulate a voltage at the transformer of the isolator module.

In the non-limiting embodiment, the first and second current limiters are coordinated with one another to protect the fuse against overcurrent events, and the first and second overvoltage devices are coordinated with one another to protect the fuse against overvoltage events.

FIG. 6 is a top view of exemplary miniaturized isolator module 600. In FIG. 6, a laminate substrate 602 (e.g., PCB) has protection circuitry 610a, 610b, and 650, driver circuitry 620, receiver circuitry 640, and first and second isolators 630a and 630b mounted thereon. Driver circuitry 620 and receiver circuitry 640 are each formed on respective semiconductor dies and adhered to the surface of substrate 602. Driver circuitry 620 may be configured in the manner described for driver circuitry 220a and/or 220b, and receiver circuitry 640 may be configured in the manner described for receiver circuitry 240a and/or 240b, in connection with FIG. 2. Protection circuitry 610a, 610b, and 650 are each formed on respective semiconductor dies and adhered to the surface of substrate 602. Protection circuitry 610a may be configured in the manner described for protection circuitry 210a, protection circuitry 610b may be configured in the manner described for protection circuitry 210b, and protection circuitry 650 may be configured in the manner described for protection circuitry 250a and/or 250b, in connection with FIG. 2. For example, protection circuitry 610a, 610b, and/or 650 may include one or more active protection circuits as described in connection with FIGS. 3A-3F, 4A-4F, and 5. In some embodiments, one or more active protection circuits may be formed on a same semiconductor die as driver circuitry 620 and/or receiver circuitry 640. Isolators 630a and 630b may be configured in the manner described for isolators 230a and 230b in connection with FIG. 2. For example, first isolator 630a is shown configured for power transmission across an isolation barrier, and second isolator 630b is shown configured for data transmission across the isolation barrier. Passive components 604, may include resistors and capacitors.

Miniaturized isolator module 600 of FIG. 6 has a lower profile than conventional isolator modules at least in part due to silicon protection devices employed in the isolator module which maintain IS compliance at a reduced size compared to conventional protection devices for IS compliance. In FIG. 6, the isolation barrier of isolator 630b includes part of a body of substrate 602, as coils of the transformer of isolator 630b are wound about the substrate with the substrate isolating the primary and secondary coils of the transformer from one another. In FIG. 6, the isolation barrier of isolator 630a includes a second substrate (not shown) mounted on substrate 602, with the coils of the transformer of isolator 630a wound about a magnetic core of the second substrate, and with gaps in the magnetic core filled by insulation material. In some embodiments, the isolation barriers of isolator 630a and/or 360b may be at least 200 microns thick, such as 400 microns, 600 microns, 800 microns, or 1 mm. An insulative housing (not shown) may be disposed around substrate 602, isolators 630a and 630b, and semiconductor dies/packages. In some embodiments, coils of the transformer of isolator 630a may be wound about substrate 602, and/or coils of the transformer of isolator 630b may be wound about a magnetic core of an additional substrate mounted to substrate 602. In some embodiments, 630a and 630b may be the same type of isolator. For example, both may have a laminate construction. In alternative embodiments, both may have a magnetic core around which the windings wrap.

FIG. 7 is a block diagram illustrating an example of a system comprising an isolator of the types described herein. The system may comprise isolator module 700, high energy device 760, and low energy device 770. In some embodiments, high energy device 760 may comprise a device operating at less than 500V. In some embodiments, high-voltage device 770 may comprise a device exposed to a high amount of energy and/or power, such as large currents. In some embodiments, low energy device 770 may need to be maintained under intrinsic safety conditions, such that low energy device 770 is not exposed to a high amount of energy and/or power. For example, low energy device 770 may be situated in, and/or connected to devices situated in, an explosive environment.

Isolator module 700 may be implemented using miniaturized isolator module 100, 200 or 600, and may be disposed between the high energy device and the low energy device. By isolating the two devices from one another, the high energy device may be exposed to large amounts of energy and/or power without exposing the low energy device to the large amounts of energy and/or power. In one example, high energy device 760 may comprise a user interface unit, such as a computer or other types of terminals, and/or a communication interface, such as a cable, an antenna or an electronic transceiver, and low energy device 770 may comprise a transmission and/or control circuitry connected to a sensor 780 situated in an explosive environment.

Active silicon components described herein may be formed using silicon alone or in combination with other materials, such as silicon nitride, silicon germanium, and other such silicon-based materials in accordance with various embodiments. It should be appreciated that active silicon components described herein may be formed using other semiconductor materials such as gallium arsenide and/or gallium nitride in accordance with various embodiments. In addition, some components described herein as active silicon components may be replaced or implemented by passive components in accordance with various embodiments. In accordance with various embodiments, Zener diodes described herein may be located on-chip or in discrete form.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An isolator module for intrinsic safety applications, comprising:
a substrate;
a first transformer integrated with the substrate, comprising:
a primary coil disposed on a first side of an isolation barrier; and
a secondary coil disposed on a second side of the isolation barrier;
a first silicon protection device on the substrate coupled between a first input of the isolator module and the primary coil of the first transformer;
a second transformer integrated with the substrate, comprising:
a primary coil disposed on the first side of the isolation barrier; and
a secondary coil disposed on a second side of the isolation barrier; and
a second silicon protection device on the substrate coupled between a second input of the isolator module and the primary coil of the second transformer.

2. The isolator module of claim 1, wherein the first silicon protection device comprises:
at least one first semiconductor die having formed thereon:
an overvoltage device; and
a current limiter; and
a fuse coupled to the overvoltage device and the current limiter.

3. The isolator module of claim 2, wherein:
the second transformer is formed in and around the substrate.

4. The isolator module of claim 1, wherein:
the second silicon protection device comprises at least one second semiconductor die having formed thereon an intrinsically safe resistor.

5. The isolator module of claim 1, wherein:
the first transformer is configured to transfer a power signal across the isolation barrier; and
the second transformer is configured to transfer a data signal across the isolation barrier.

6. The isolator module of claim 5, wherein the second transformer is further configured to transfer data signals bi-directionally across the isolation barrier.

7. The isolator module of claim 1, further comprising:
a third silicon protection device on the substrate coupled between the secondary coil of the first transformer and a first output of the isolator module; and
a fourth silicon protection device on the substrate coupled between the secondary coil of the second transformer and a second output of the isolator module.

8. The isolator module of claim 7, wherein:
the third silicon protection device comprises at least one third semiconductor die having formed thereon:
an overvoltage device; and
a current limiter; and
the fourth silicon protection device comprises at least one fourth semiconductor die having formed thereon:
an intrinsically safe resistor.

9. The isolator module of claim 7, wherein the first, second, third and fourth silicon protection devices are configured to maintain intrinsic safety (IS) compliance on the second side of the isolation barrier.

10. A protection device for use with an isolator module, comprising:
a first semiconductor die having formed thereon:
a first current limiter;
a first overvoltage device; and
a fuse,
wherein the first current limiter and the first overvoltage device are configured to protect the fuse against overvoltage and overcurrent events.

11. The protection device of claim 10, wherein:
the first current limiter is positioned to limit a current provided from a first side to a second side of the isolator module; and
the first overvoltage device is positioned to limit a voltage at a first input of the isolator module.

12. The protection device of claim 11, wherein:
the first current limiter comprises an active current limiter configured to regulate the current provided to a transformer of the isolator module; and
the first overvoltage device comprises a Zener diode configured to regulate the voltage at the transformer of the isolator module.

13. The protection device of claim 10, wherein:
responses of the first current limiter and the first overvoltage device are coordinated with one another to protect the fuse against the overvoltage and overcurrent events.

14. The protection device of claim 10, wherein:
the first current limiter and the first overvoltage device are configured to respond to overvoltage and overcurrent events before the fuse is blown.

15. The protection device of claim 10, wherein the first semiconductor die further comprises formed thereon:
a second current limiter; and
a second overvoltage device,
wherein the second current limiter and the second overvoltage device are configured to protect the fuse against overvoltage and overcurrent events.

16. The protection device of claim 15, wherein:
the first and second current limiters comprise first and second active current limiters configured to regulate a current provided to a transformer of the isolator module; and
the first and second overvoltage devices comprise first and second Zener diodes configured to regulate a voltage at the transformer of the isolator module.

17. The protection device of claim 15, wherein:
the first and second current limiters are coordinated with one another to protect the fuse against overcurrent events; and
the first and second overvoltage devices are coordinated with one another to protect the fuse against overvoltage events.

18. An isolator module for intrinsic safety applications, comprising:
a laminate substrate;
a first transformer formed in and around the laminate substrate, comprising:
a primary coil disposed on a first side of an isolation barrier and coupled to an input of the isolator module; and
a secondary coil disposed on a second side of the isolation barrier and coupled to an output of the isolator module; and
a first silicon protection device on the laminate substrate coupled between a first input of the isolator module and the primary coil of the first transformer.

19. The isolator module of claim 18, wherein the primary and secondary coils each comprise:
an electrical conductor forming a plurality of loops,
wherein the each of the plurality of loops of the electrical conductor is surrounded by a first insulating layer.

20. The isolator module of claim 19, wherein the pluralities of loops of the primary and secondary coils are wound around a common magnetic core, with a second insulating layer disposed in gaps between the first insulating layer and the common magnetic core.

* * * * *